US012720831B2

(12) United States Patent
Jelinek et al.

(10) Patent No.: US 12,720,831 B2
(45) Date of Patent: Aug. 25, 2026

(54) METHOD FOR PRODUCING A SiC SUPERJUNCTION DEVICE

(71) Applicant: Infineon Technologies AG, Neubiberg (DE)

(72) Inventors: Moriz Jelinek, Villach (AT); Jens Peter Konrath, Villach (AT); Hans-Joachim Schulze, Taufkirchen (DE); Andre Rainer Stegner, Unterhaching (DE)

(73) Assignee: Infineon Technologies AG, Neubiberg (DE)

(*) Notice: Subject to any disclaimer, the term of this patent is extended or adjusted under 35 U.S.C. 154(b) by 688 days.

(21) Appl. No.: 18/121,713

(22) Filed: Mar. 15, 2023

(65) Prior Publication Data

US 2023/0299147 A1 Sep. 21, 2023

(30) Foreign Application Priority Data

Mar. 15, 2022 (DE) ........................ 102022106015.2

(51) Int. Cl.
*H10D 62/832* (2025.01)
*H10D 8/60* (2025.01)
(Continued)

(52) U.S. Cl.
CPC ........... *H10D 62/8325* (2025.01); *H10D 8/60* (2025.01); *H10D 12/031* (2025.01); *H10D 62/111* (2025.01); *H10P 74/207* (2026.01)

(58) Field of Classification Search
None
See application file for complete search history.

(56) References Cited

U.S. PATENT DOCUMENTS 9,012,980 B1 4/2015 Schulze et al.
2008/0122001 A1* 5/2008 Pfirsch ................ H01L 21/266 257/E29.345

(Continued)

FOREIGN PATENT DOCUMENTS

DE 102015106979 A1 11/2016
DE 102015115173 A1 3/2017
JP 2007251023 A 9/2007

OTHER PUBLICATIONS

P. Hazdra, et al.; Total Irradiation Dose Effects on 4H-SIC Power Devices, Conference Proceedings ISPSD 2018; Czech Technical University in Prague; Department of Microelectronics; Aug. 29-31; 27 Pgs.

*Primary Examiner* — Xiaoming Liu
(74) *Attorney, Agent, or Firm* — Cooper Legal Group LLC

(57) ABSTRACT

Disclosed is a method that includes: measuring at least one characteristic of a superjunction region of a SiC superjunction device, wherein the superjunction region is arranged in a semiconductor body and comprises a plurality of first regions of a first doping type and a plurality of second regions of a second doping type complementary to the first doping type; and generating dopant like defects of one doping type in the superjunction region in a doping process. At least one parameter of the doping process is adjusted dependent on the at least one measured characteristic. The doping process includes an implantation process in which particles are implanted into the semiconductor body to form crystal defects in the semiconductor body in the superjunction region, and an annealing process in order to form the dopant like defects based on the crystal defects.

21 Claims, 8 Drawing Sheets

(51) Int. Cl.
*H10D 12/01* (2025.01)
*H10D 62/10* (2025.01)
*H10P 74/20* (2026.01)

(56) References Cited

U.S. PATENT DOCUMENTS

2016/0329398 A1* 11/2016 Weber .................. H01L 21/263
2020/0006496 A1* 1/2020 Bauer ................. H10D 30/668

* cited by examiner

METHOD FOR PRODUCING A SiC SUPERJUNCTION DEVICE

RELATED APPLICATION

This application claims priority to German Patent Application No. 102022106015.2, filed on Mar. 15, 2022, entitled "METHOD FOR PRODUCING A SIC SUPERJUNCTION DEVICE", which is incorporated by reference herein in its entirety.

TECHNICAL FIELD

This disclosure relates in general to a method for producing a silicon carbide (SiC) superjunction device.

SUMMARY

A superjunction device may include a superjunction region with a plurality of first regions of a first doping type (e.g., a first conductivity type) and/or a plurality of second regions of a second doping type (e.g., a second conductivity type) complementary to the first doping type. The first regions may be referred to as drift regions and the second regions may be referred to as compensation regions.

A superjunction device can be operated in a conducting state and/or a blocking state. In the conducting state, the superjunction device may be operated such that a current can flow through the drift regions. In the blocking state, the superjunction device may be operated such that pn-junctions between the drift and compensation regions are reverse biased so that depletion regions (e.g., space charge regions) expand in the drift and/or compensation regions. These depletion regions may be associated with an electric field, wherein an Avalanche breakdown may occur when a voltage that reverse biases the pn-junctions between the first and second regions is such that a magnitude of the electric field reaches a critical value.

The voltage blocking capability, which may define a maximum voltage that can be applied to the superjunction devices without causing an Avalanche breakdown, may be dependent on a ratio between the amount of first type dopant atoms in the first regions and the amount of second type dopant atoms in the second regions.

There may be a need to precisely adjust this ratio.

One example relates to a method. The method may include measuring at least one characteristic of a superjunction region of a SiC superjunction device, wherein the superjunction region may be arranged in a semiconductor body and/or may comprise a plurality of first regions of a first doping type and/or a plurality of second regions of a second doping type (wherein the second doping type may be complementary to the first doping type, for example); and generating dopant like defects in the superjunction region in a doping process. At least one parameter of the doping process may be adjusted based on and/or dependent on the at least one measured characteristic. The doping process may include an implantation process in which particles may be implanted into the semiconductor body to form crystal defects in the semiconductor body in the superjunction region, and/or an annealing process in order to form the dopant like defects based on the crystal defects.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

Figure 1:
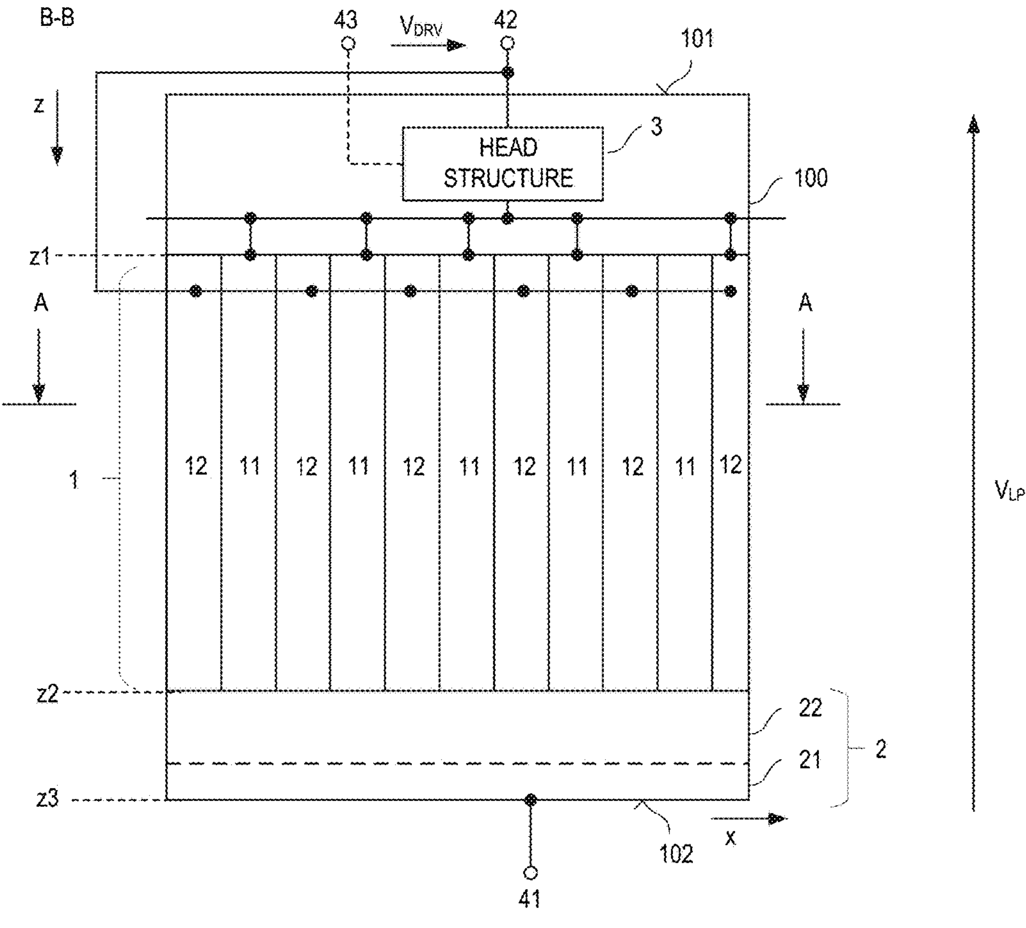
FIG. 1 illustrates a vertical cross sectional view of a superjunction device according to one example.

One example relates to a method that includes measuring at least one characteristic of a superjunction region of a SiC superjunction device, wherein the superjunction region is arranged in a semiconductor body and/or includes a plurality of first regions of a first doping type and/or a plurality of second regions of a second doping type that may be complementary to the first doping type. The method further includes generating dopant like defects of one doping type in the superjunction region in a doping process, wherein at least one parameter of the doping process may be based on and/or may be adjusted dependent on the at least one measured characteristic. The doping process includes an implantation process in which particles are implanted into the semiconductor body to form crystal defects in the semiconductor body in the superjunction region, and/or an annealing process in order to form the dopant like defects based on the crystal defects.

According to one example, measuring the at least one characteristic of the superjunction region includes measuring a voltage blocking capability of the superjunction device.

According to one example, measuring the at least one characteristic of the superjunction region includes measuring a vertical doping profile of the superjunction region.

According to one example, the at least one parameter of the doping process is an implantation dose of the implanted particles.

According to one example, the at least one parameter of the doping process is a temperature of the annealing process.

According to one example, the temperature of the annealing process is between 200° C. and 900° C. and/or is selected from between 200° C. and 900° C.

According to one example, the particles include at least one of protons, helium ions, and/or electrons.

According to one example, the dopant like defects are acceptor like defects.

According to one example, the semiconductor body includes a first surface, a second surface opposite the first surface, and/or a semiconductor layer of the first doping type between the superjunction region and the second surface. According to one example, the particles are implanted via the first surface.

According to one example, an implantation energy in the implantation process may be selected such that an end-of-range of the implantation process is located in the semiconductor layer.

According to one example, the semiconductor layer includes a first partial layer and/or a second partial layer, wherein the second partial layer may be arranged between the superjunction region and the first partial layer, and/or wherein the implantation energy may be selected such that the end-of-range is located in the first partial layer.

According to one example, the semiconductor layer includes a first partial layer and/or a second partial layer, wherein the second partial layer may be arranged between the superjunction region and the first partial layer, and/or wherein the implantation energy may be selected such that the end-of-range is located in the second partial layer.

According to one example, the particles are implanted via at least one of (e.g., only one of) the first and/or second surfaces, and/or wherein an implantation energy in the implantation process may be selected such that an end-of-range of the implantation process is located in the superjunction region.

According to one example, the implantation processes includes at least two partial implantation processes, wherein the at least two partial implantation processes have different implantation energies.

According to one example, the superjunction device includes a head structure which is at least partially arranged between the superjunction region and the first surface, and/or wherein the particles are implanted into the superjunction region through the head structure.

According to one example, the superjunction device is a superjunction transistor, and/or wherein the head structure includes a plurality of transistor cells.

According to one example, the superjunction device is a superjunction diode, and/or wherein the head structure includes at least one of (e.g., only one of) an anode region and/or a cathode region.

According to one example, the semiconductor body forms a portion of a wafer that includes a plurality of semiconductor bodies.

According to one example, in the implantation process, the same implantation dose is applied at each position of the wafer.

According to one example, measuring the at least one characteristic includes measuring the at least one characteristic at different lateral positions of the wafer, and/or wherein, in the implantation process, different implantation doses may be applied at the different lateral positions dependent on the at least characteristic measured at the respective lateral position.

In the following detailed description, reference is made to the accompanying drawings. The drawings form a part of the description and for the purpose of illustration show examples of how the disclosed subject matter may be used and implemented. It is to be understood that the features of the various embodiments described herein may be combined with each other, unless specifically noted otherwise.

FIG. 1 schematically illustrates a sectional view of one section of a superjunction device. The superjunction device includes a semiconductor body 100 and a superjunction region 1 arranged in the semiconductor body 100. The superjunction region 1 includes a plurality of first regions 11 of a first doping type (e.g., a first conductivity type) and a plurality of second regions 12 of a second doping type (e.g., a second conductivity type) which may be complementary to the first doping type. The first regions 11 and the second regions 12 may be arranged alternately in the semiconductor body 100, and a pn-junction may be formed between each first region 11 and a corresponding adjoining second region 12. Just for the purpose of illustration, in the example shown in FIG. 1, the first regions 11 and the second regions 12 are arranged alternately in a first lateral direction x of the semiconductor body 100.

The semiconductor body 100 may be based on silicon carbide (SiC). In this context, "based on SiC" may mean that the semiconductor body 100 may comprise or essentially consist of SiC, except for impurities (e.g., unwanted impurities) or intentional doping.

Figure 2:
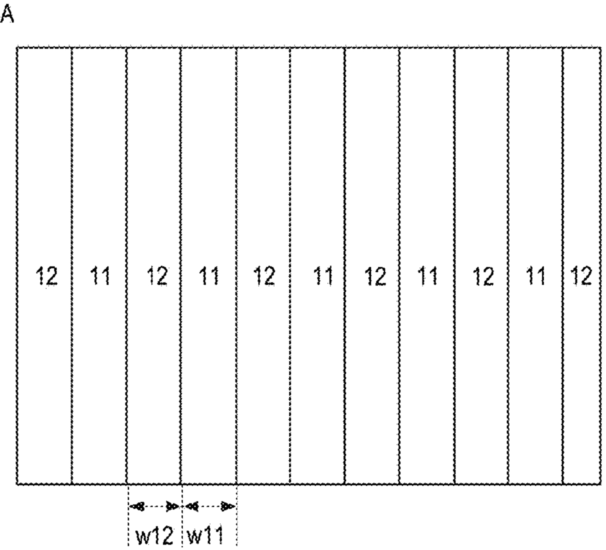
FIG. 2 illustrates a horizontal cross sectional view of one example of a superjunction region of the superjunction device.

The first and second regions 11, 12 may be elongated in a second lateral direction y of the semiconductor body 100. This is illustrated in FIG. 2 that shows a horizontal cross sectional view of the semiconductor body 100 according to FIG. 1 in a horizontal section plane A-A. The "horizontal section plane A-A" is a section plane that is perpendicular to the vertical section plane shown in FIG. 1. The second lateral direction y may be essentially perpendicular to the first lateral direction x, according to one example. The first and second regions 11, 12 being "elongated" means that a length of the first and second regions 11, 12, which is a dimension in the second lateral direction y, may be significantly greater than a respective width, which is a dimension in the first lateral direction. In the examples shown in FIGS. 1 and 2, the width w11, w12 is the dimension in the first lateral direction x and the "length" is the dimension in the second lateral direction y of the semiconductor body 100. According to one example, "significantly greater" means that a ratio between the length and the width is greater than 10, greater than 100, or even greater than 1000.

Referring to FIG. 1, the first regions 11 are connected to a first load node 41 of the superjunction device, and the second regions 12 are connected to a second load node 42 of the transistor device. A connection between the second regions 12 and the second load node 42 is only schematically illustrated in FIG. 1. Examples of how these connections can be implemented are explained with reference to examples herein further below.

According to one example, the first regions 11 are connected to the first load node 41 via a further semiconductor region 21 of the first doping type. The further semiconductor region 21 may adjoin the first regions 11. This, however, is not shown in FIG. 1. Optionally, as shown in FIG. 1, a buffer region 22 of the first doping type is arranged between the further semiconductor region 21 and the first regions 11. According to one example, a doping concentration of the buffer region 22 is lower than a doping concentration of the further semiconductor region 21. According to one example, the doping concentration of the buffer region 22 is lower than the doping concentration of the further semiconductor region 21 and may be less than 50%, less than 20% or even less than 5% of the doping concentration of the further semiconductor region 21. According to one example, the doping concentration of the further semiconductor region 21 is selected from between 1E18 $cm^{-3}$ and 1E19 $cm^{-3}$, and the doping concentration of the buffer region 22 is selected from between 1E17 $cm^{-3}$ and 3E18 $cm^{-3}$.

The further semiconductor region 21 and the optional buffer region 22 may be part of a contiguous semiconductor layer 2 of the first doping type, wherein the semiconductor layer 2 may be arranged between the superjunction region 1 and a second surface 102 of the semiconductor body 100.

The semiconductor layer 2 may include a semiconductor substrate that forms the further semiconductor region 21 and an optional epitaxial layer formed on the substrate, wherein the epitaxial layer may form the buffer region 22.

Referring to FIG. 1, the superjunction device further includes a head structure 3 connected between the second load node 42 and the first regions 11. The head structure 3 may at least partially be integrated in the semiconductor body 100. That is, the head structure may at least partially be arranged between the superjunction region 1 and a first surface 101 opposite the second surface 102 of the semiconductor body 100. Examples of how the head structure 3 may be implemented are explained with reference to examples herein further below.

Basically, the head structure 3 may define an operating state of the superjunction device, wherein the operating state may include a conducting state and/or a blocking state. In the conducting state, the superjunction device is configured to conduct a current via the first regions 11 between the first load node 41 and the second load node 42 when a voltage is applied between the first load node 41 and the second load node 42. In the blocking state, the superjunction device is configured to block when a voltage is applied between the first load node 41 and the second load node 42, provided that the voltage is lower than a voltage blocking capability of the superjunction device. The "voltage blocking capability" is the maximum voltage the superjunction device can withstand in the blocking state. Voltages higher than the voltage blocking capability may cause an Avalanche breakdown.

The implementation of the head structure 3 is dependent on the type of the superjunction device. The superjunction device may be implemented as a passive device, such as a Schottky diode. In this case, the operating state of the superjunction device is only dependent on a polarity of a load path voltage $V_{LP}$ applied between the first load node 41 and the second load node 42, wherein the superjunction device is in the conducting state when the load path voltage $V_{PL}$ has a first polarity and the blocking state when the load path voltage $V_{PL}$ has a second polarity which may be opposite the first polarity.

The superjunction device may also be implemented as an active device, such as a transistor device. In this case, the control structure may include a control node 43 (illustrated in dashed lines in FIG. 1) that is configured to control a conducting channel between the second load node 42 and the first regions 11 dependent on a drive voltage $V_{DRV}$ applied between the control node 43 and the second load node 42. In a transistor device, the first load node 41 may be referred to as drain node, the second load node 42 may be referred to as source node, the control node 43 may be referred to as gate node, the load path voltage $V_{LP}$ may be referred to as drain-source voltage, and/or the drive voltage $V_{DRV}$ may be referred to as gate-source voltage. The further semiconductor region 21 may form a drain region of the transistor device.

A transistor device can be operated in a forward biased state and/or a reverse biased state. Whether the device is in the forward biased state or the reverse biased state may be dependent on a polarity of the load path voltage (drain-source voltage) $V_{LP}$. In the reverse biased state, the polarity and/or a magnitude of the drain-source voltage $V_{LP}$ is such that the pn-junction between the first and second regions 11, 12 are forward biased independent of the drive voltage (gate-source voltage) $V_{DRV}$. Thus, in the reverse biased state, the transistor device may conduct a current independent of an operating state of the head structure 3.

In the forward biased state of the transistor device, the polarity of the drain-source voltage $V_{DS}$ is such that the operating state can be controlled by the gate-source voltage $V_{DRV}$. In the forward biased state, the transistor device can be operated in the conducting state (e.g., on-state) or the blocking state (e.g., off-state). In the on-state, the head structure 3 may generate a conducting channel between the second load node 42 and the first regions 11 so that a current can flow between the first load node 41 and the second load node 42 via the head structure 3 and the first regions 11 of the first doping type. In the off-state, the conducting channel in the head structure 3 may be interrupted.

The superjunction device may have a current flow direction, which may be a direction in which a current may flow between the first load node 41 and the second load node 42 inside the semiconductor body 100 in the first regions 11. In the example shown in FIG. 1, the current flow direction corresponds to the vertical direction z of the semiconductor body 100, so that the further semiconductor region 21 is spaced apart from the head structure 3 in the vertical direction z. The vertical direction z may run perpendicular to the first lateral direction x and the second lateral direction y, along which the semiconductor body 100 may mainly expand. The first surface 101 of the semiconductor body is a surface below which active regions of the head structure 3 are integrated in the semiconductor body 100. The second surface 102, as outlined above, is formed by the further semiconductor region 21. The "vertical cross sectional view" illustrated in FIG. 1 is a sectional view in a section plane perpendicular to the first surface 101 and the second surface 102 and parallel to the vertical direction z.

In the blocking state of the superjunction device, space charge regions (e.g., depletion regions) expand in the first regions 11 and the second regions 12, so that the first regions 11 and/or the second regions 12 may become depleted of charge carriers as the load path voltage increases. In this way, fixed charge carriers in the first regions 11 may be "compensated" by fixed charge carriers in the second regions 12. Thus, the second regions 12 may also be referred to as compensation regions and/or the first regions 11 may (also, for example) be referred to as drift regions.

As compared to a conventional device that is devoid of the second regions 12, the first regions 11 can be implemented with a higher doping concentration, wherein the higher doping concentration of the first regions 11 results in a reduced on-resistance as compared to the conventional device. The "on-resistance" is the electrical resistance of the device between the first load node 41 and the second load node 42 in the conducting state.

The superjunction device may be implemented as an n-type device and/or as a p-type device. In an n-type device, the first doping type is an n-type and the second doping type is a p-type, so that the first regions 11 are n-doped and the second regions are p-doped. In a p-type device, the first doping type is a p-type and the second doping type is an n-type, so that the first regions 11 are p-doped and the second regions are n-doped.

In the manufacturing process of a superjunction device, such as a superjunction device of the type shown in FIG. 1, it may be desirable to precisely adjust a relationship between the amount of dopants of the first doping type and the amount of dopants of the second doping type that are included in the superjunction region 1.

Figure 3:
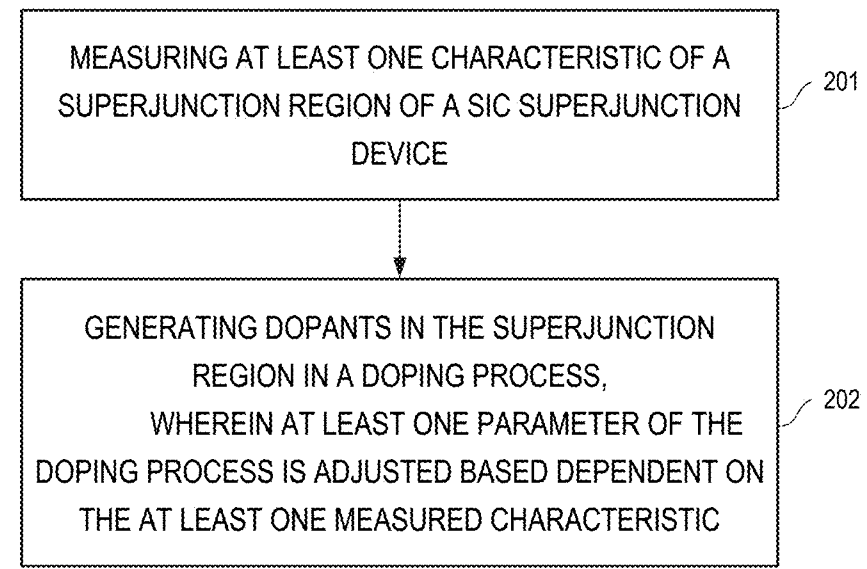
FIG. 3 illustrates one example of a doping process for processing the superjunction region, wherein the method includes an implantation process.

One example of a method for adjusting the relationship between the amount of dopants of the first doping type and the amount of dopants of the second doping type that are included in the superjunction region 1 is illustrated in FIG. 3.

Referring to FIG. 3, the method includes measuring at least one characteristic of the superjunction region of the SiC superjunction device, and/or generating dopant like defects in the superjunction region. These dopant like defects may have a doping effect in the same way as dopants of a certain doping type (e.g., n-type or p-type, donors or acceptors). A process for forming the dopant like defects is referred to as doping process in the following, wherein at least one parameter of the doping process may be adjusted based dependent on the at least one measured characteristic.

The doping process includes an implantation process in which particles are implanted into the semiconductor body 100 such that, in the superjunction region, crystal defects are generated in the crystal lattice of the semiconductor body 100. Such defects may include single defects, such as carbon vacancies, and/or defect complexes, such as complexes including vacancies and/or interstitials. The doping process further includes an annealing process. The defects remaining after the annealing process are referred to as dopant like defects herein. The defects formed by the implantation process may include dopant like defects and/or may further include precursor defects to the dopant like defects. The annealing process stabilizes dopant like defects and/or promotes the formation of dopant like defects from the precursor defects.

The dopant like defects may act like dopants but may not include donor atoms and/or acceptor atoms incorporated into the crystal lattice of the semiconductor body 100. According to one example, (only, for example) dopant like defects of one doping type are formed in the superjunction region 1 in the doping process (and/or dopant like defects of one or more other doping types are not formed in the superjunction region 1 in the doping process). According to one example, acceptor like defects, which may be dopant like defects acting like acceptors, are formed in the doping process.

According to one example, the particles may include at least one of protons, helium ions, and/or electrons. According to one example, the dopant like defects are acceptor like complexes.

Figure 4:
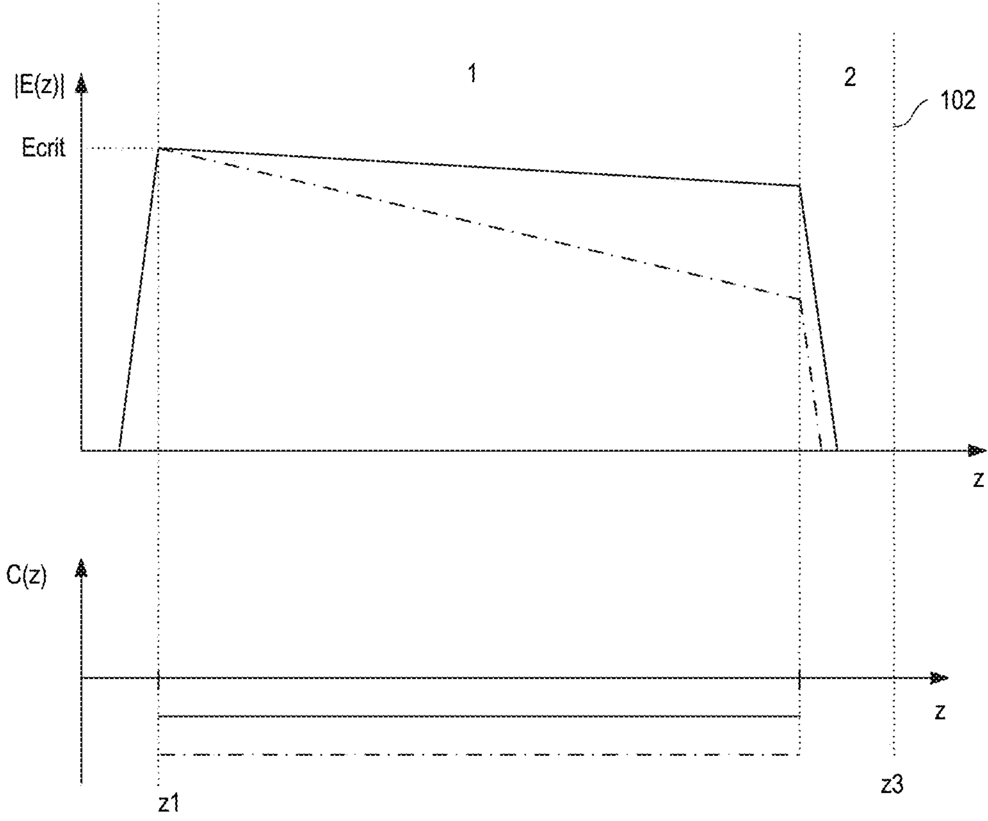
FIG. 4 illustrates one example of degree of compensation profiles and electric field profiles of the superjunction region before and after the doping process.

The effect of forming dopant like defects in the superjunction region 1 is explained with reference to FIG. 4 in the following. FIG. 4 schematically illustrates the degree of compensation C(z) in the superjunction region 1 and/or schematically illustrates the magnitude of the electric field |E(z)| in the superjunction region 1 when the superjunction device is in the blocking state.

In the blocking state, when a load path voltage $V_{LP}$ is applied to the superjunction device, pn junctions between first and second regions 11,12 and junctions between the head structure 3 and the first regions 11 are reverse biased, so that space charge regions (depletion regions) expand in the first regions 11 and/or the second regions 12. Junctions between the head structure 3 and the first regions 11 are not illustrated in FIG. 1. These junctions may include pn-junctions, such as pn-junctions between body regions and the first regions in a MOSFET, or Schottky junctions, such as Schottky junctions between a Schottky metal and the first regions 11 in a Schottky diode, and are explained herein further below. The space charge regions expanding in the first and second regions 11, 12 are associated with an electric field, wherein FIG. 4 (only, for example) illustrates a vertical component of the electric field.

The profile of the magnitude of the electric field |E(z)| is highly dependent on a degree of compensation C(z) of the superjunction region 1. The degree of compensation C(z) at a certain vertical position z is given by $$C(z) = 2 \cdot \frac{D_{11}(z) - D_{12}(z)}{D_{11}(z) + D_{12}(z)}, \tag{1}$$

where $D_{11}(z)$ denotes the number (amount) of first type dopants in the superjunction region 1 at a certain vertical position z, and $D_{12}(z)$ denotes the number of second type dopants in the superjunction region 1 at the position z. "Dopants" in this context include dopant atoms and/or dopant like defects. The degree of compensation C(z) may be negative when the number of first type dopants prevails (e.g., prevails over and/or exceeds) the number of second type dopants at a certain vertical position z, and/or the degree of compensation C(z) may be positive when the number of second type dopants prevails (e.g., prevails over and/or exceeds) the number of first type dopants at a certain vertical position z.

Referring to the above, the first regions 11 are regions of the first doping type and/or the second regions 12 are regions of the second doping type. This includes that the first regions 11 have an effective doping concentration of the first doping type and/or the second regions 12 have an effective doping concentration of the second doping type. Nevertheless, the first regions 11 may also include dopants of the second doping type and/or the second regions 12 may also include dopants of the first doping type. Thus, $D_{11}(z)$ considers first type dopants at a certain vertical position in the first and/or second regions 11, 12 and/or $D_{12}(z)$ considers second type dopants at the certain vertical position in the first and/or second regions 11, 12.

In FIG. 4, the dashed and dotted lines represent the degree of compensation profile and the magnitude of the electric field |E(z)| after forming the superjunction region 1 with the first and second regions 11, 12 and before the additional doping process. The "degree of compensation profile" represents the degree of compensation C(z) along the vertical direction. Just for the purpose of illustration and explanation it may be assumed that the degree of compensation may essentially be the same at each vertical position of the superjunction region 1, which may extend from a first vertical position z1 to a second vertical position z2 in the semiconductor body.

Furthermore, for the purpose of illustration, it may be assumed that the degree of compensation C(z) is negative, so that, at each vertical position of the superjunction region 1, the amount of first type dopants, which are the dopants mainly included in the first regions 11, prevails (e.g., prevails over and/or exceeds) the amount of second type dopants, which are the dopants mainly included in the second regions 12. Furthermore, it may be assumed that the first type dopants are n-type dopants. In this case the magnitude of the electric field |E(z)| has a profile as illustrated in FIG. 4. In this case, a maximum of the electric field may occur at the junction between the first regions 11 and the head structure. The electric field, within the superjunction region 1, gradually decreases towards the second surface 102, and/or decreases to zero in the semiconductor layer 2, which extends between the second vertical position z2 and a third vertical position z3. The third vertical position z3 being the position of the second surface 102.

An Avalanche breakdown may occur when the magnitude of the electric field |E(z)| reaches a critical value Ecrit. The voltage blocking capability of the superjunction device may essentially be given by the integral of the magnitude of the electric field, that is, the voltage blocking capability is essentially proportional to the area below the curve representing the magnitude of the electric field |E(z)|. In SiC, the critical value may be between about 1.5E6 V/cm and 2.0E6 V/cm and/or may be based on and/or dependent on the effective doping concentration in the second regions 12, for example. The latter, however, is not considered in the diagram according to FIG. 4.

The solid lines in FIG. 4 illustrate the degree of compensation C(z) and the magnitude of the electric field |E(z)| after homogenously doping the superjunction region 1 with dopant like defects of the second doping type. In the example, the degree of compensation C(z) is still negative after the doping process, but the magnitude of the degree of compensation C(z) is lower after the doping process. As a consequence, a decrease of the electric field, within the superjunction region 1, is less steep. Thus, the area below the solid curve representing the electric field after the doping process is greater than the area below the dashed and dotted curve representing the electric field before the doping process, so that the voltage blocking capability has been increased by the doping process.

In the example shown in FIG. 4, the degree of compensation C(z) is essentially the same at each vertical position of the superjunction region 1. This, however, is only an example. It is also possible to implement the superjunction region 1 with a varying degree of compensation C(z) profile. In each case, however, a negative degree of compensation, for example, which may result from a dominance of first type dopant atoms in the superjunction region 1, can be reduced by forming acceptor like defects, for example, in order to shift the degree of compensation C(z) towards zero and, therefore, increase the voltage blocking capability of the superjunction device.

Referring to the above, the method includes measuring at least one characteristic of the superjunction region 1 before the doping process and/or adjusting at least one parameter of the doping process dependent on the at least one measured characteristic. According to one example the at least one measured characteristic is a measure of the voltage blocking capability of the superjunction device and/or the at least one parameter of the doping process affects the amount and/or concentration of dopant like defects formed in the doping process.

According to one example, the measured characteristic is the voltage blocking capability of the superjunction device. The voltage blocking capability may be measured by operating the superjunction device in the blocking state and/or increasing the load path voltage $V_{LP}$ until the Avalanche breakdown occurs. According to one example, the head structure 3 has already been formed when the voltage blocking capability is measured.

In this case, the particles may be implanted via the first surface 101 and through the head structure 3 into the semiconductor body 100. This is illustrated in FIG. 5 that shows a vertical cross sectional view of one section of the superjunction device during the implantation process.

Figure 5:
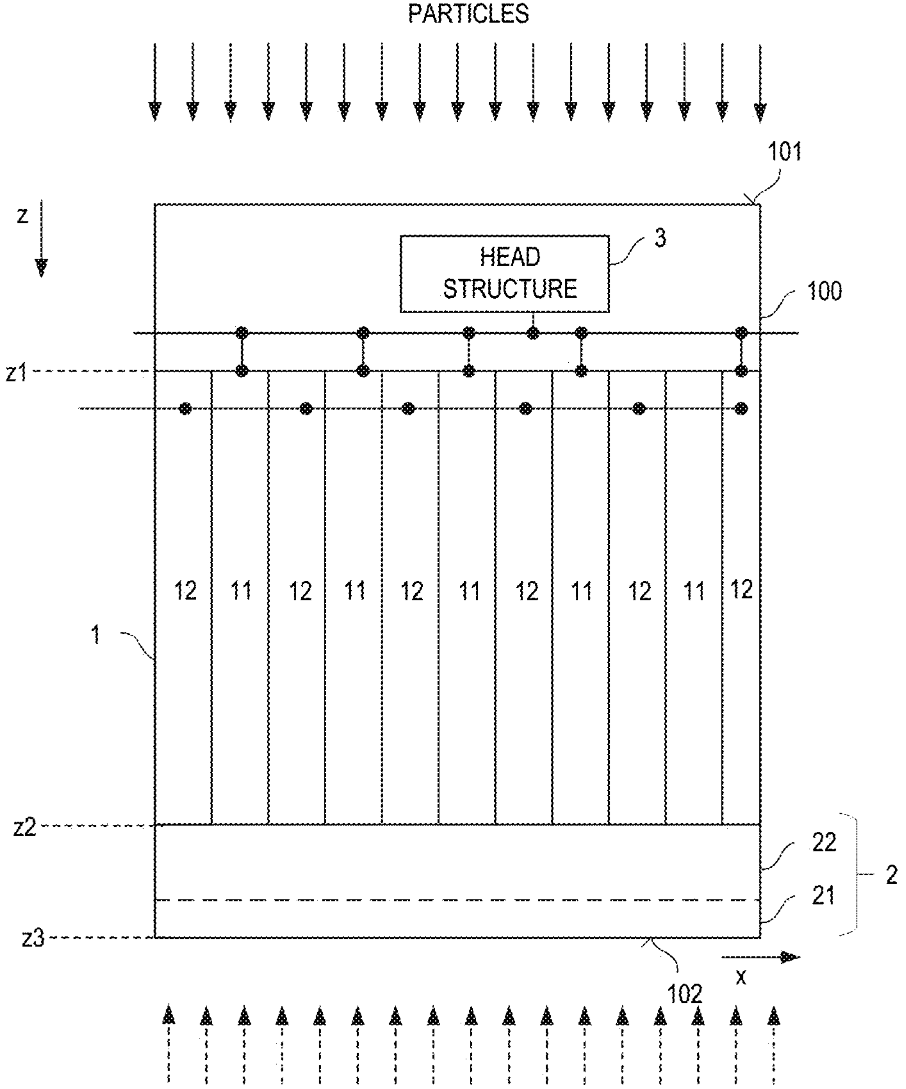
FIG. 5 illustrates the superjunction device during the implantation process according to an example.

Alternatively and/or additionally, as illustrated in dashed lines in FIG. 5, the particles may be implanted via the second surface 102 into the superjunction region 1. In some cases, the semiconductor layer 2 forming the further semiconductor region 21 and/or the optional buffer region 22 is much thicker than the superjunction region 1 during the manufacturing process of the superjunction device. That is, a vertical dimension of the semiconductor layer 2 is significantly greater than the vertical dimension of the superjunction region 1. In this case, the thickness of the second layer 2 may be reduced before implanting the particles via the second surface 102. The vertical dimension of the superjunction region 1 may be dependent on the desired voltage blocking capability of the semiconductor device. In a device with a voltage blocking capability of 1200 V, for example, the vertical dimension of the superjunction region 1 may be between 5 micrometers (μm) and 10 micrometers. The vertical dimension of the semiconductor layer 2, before reducing the thickness, may be between 100 micrometers and 350 micrometers, for example.

Reducing the thickness of the layer 2 includes reducing the thickness of the further semiconductor layer 21, which may form the drain region in a MOSFET and/or may form an anode and/or a cathode in a diode. According to one example, reducing the thickness of the semiconductor layer 2 includes reducing the thickness of the further semiconductor region 21—which, as outlined above, may be formed by a semiconductor substrate—to a thickness of below 50 micrometers (50 μm), for example. Any conventional process, such as a polishing process and/or an etching process, may be used to reduce the thickness of the further semiconductor region 21.

According to another example, the measured characteristic is the vertical doping profile of the superjunction region 1. The vertical doping profile may represent the profile of the doping concentration of the first type dopants in the first regions 11 in the vertical direction z of the semiconductor body 100, and/or the profile of the doping concentration of the second type dopants in the second regions 12 in the vertical direction z of the semiconductor body 100. Examples for obtaining the vertical doping profile are explained herein further below.

Figure 6:
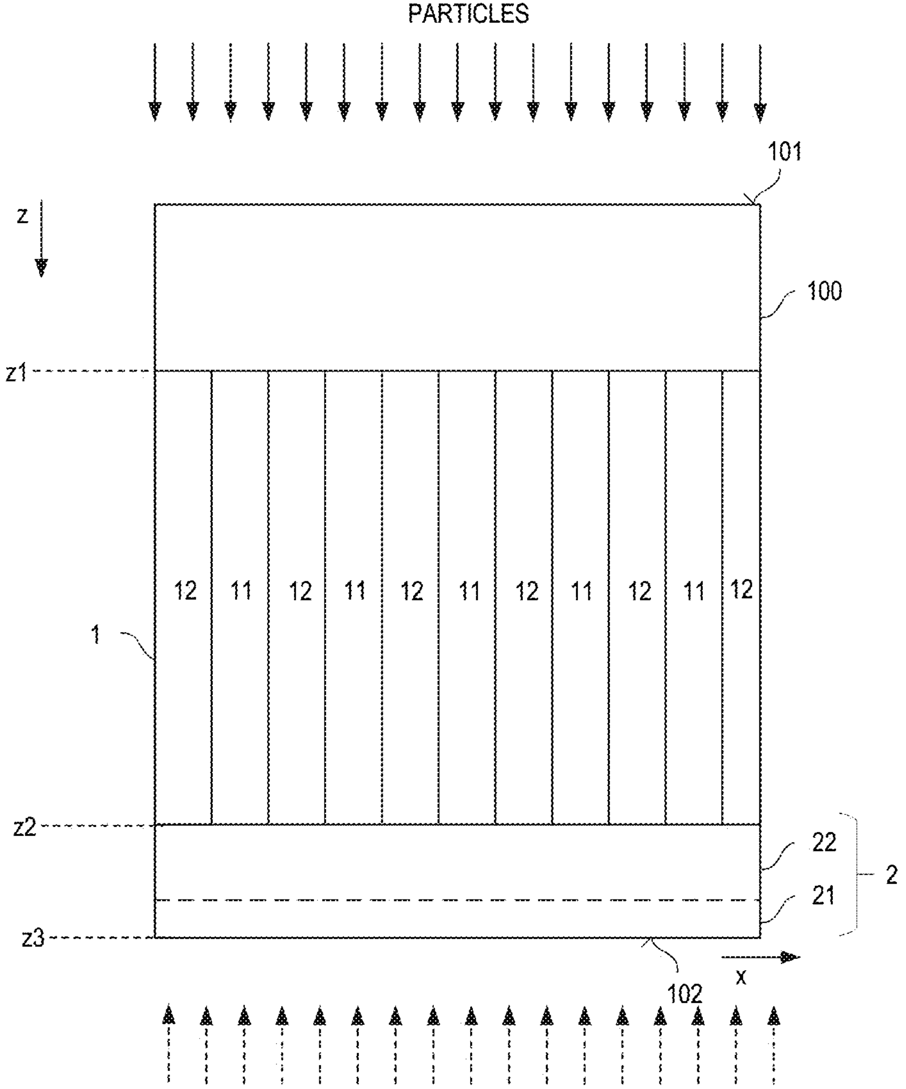
FIG. 6 illustrates the superjunction device during the implantation process according to an example.

The vertical doping profile may be measured before forming the head structure 3, so that the doping process may take place before forming the head structure 3. This is illustrated in FIG. 6, which shows a vertical cross-sectional view of one section of the superjunction device during the implantation process. The particles may be implanted via the first surface 101 into the semiconductor body 100. Alternatively and/or additionally, as illustrated in dashed lines in FIG. 6, the particles may be implanted via the second surface 102 into the semiconductor body 100. In this case, the thickness of the semiconductor layer 2 forming the further semiconductor region 21 and/or the optional buffer region 22 may be reduced before the doping process.

In each case, that is, independent of whether the doping process takes place before forming the head structure or after forming the head structure, the doping process may take place on a wafer level. That is, the doping process may be applied to a wafer 10 that includes a plurality of superjunction devices.

Figure 7:
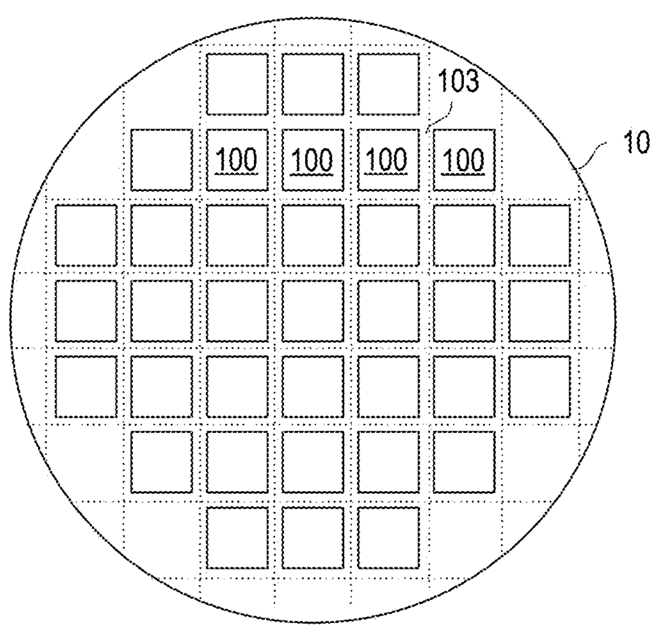
FIG. 7 illustrates one example of a wafer that includes a plurality of superjunction devices.
Figure 8:
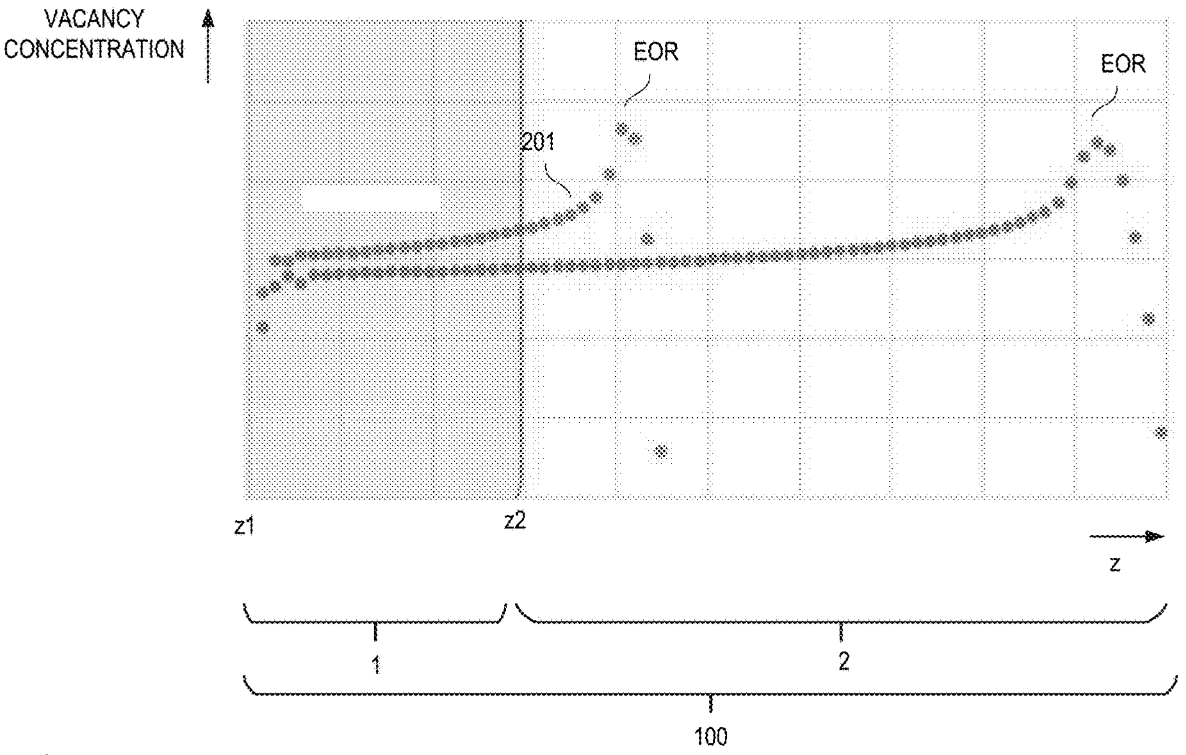
FIG. 8 illustrates examples of vacancy profiles.

FIG. 7 schematically illustrates a top view of a semiconductor wafer 10 that includes a plurality of semiconductor bodies 100 of the type shown in FIG. 5 (after forming the head structure) and/or of the type shown in FIG. 6 (before forming the head structure), for example. Dotted lines 103 shown in FIG. 8 illustrate those lines along which the wafer 1 can be separated after the processing in order to obtain a plurality of single semiconductor dies, wherein these semiconductor dies may be integrated (e.g., packaged) in a chip package to form the final superjunction device. The regions (lines) where the wafer are separated and/or which may partially be removed in the separation process may be referred to as kerf and/or kerf region.

Referring to the above, measuring the characteristic of the superjunction region 1 may include obtaining the vertical doping profile. Obtaining the vertical doping profile may include forming a measurement structure in a region that is spaced apart from the semiconductor bodies and/or that is processed in the same way as the superjunction regions 1. Measurement structures for measuring the vertical doping profile are known, so that no further explanation is required in this regard. According to one example, the measurement regions are located in the kerf region of the wafer 10. According to one example, measurement structures are formed at different positions of the wafer in order to be able to measure the vertical doping profile at different positions.

Referring to the above, the doping process may include forming dopant like defects of at least one of (e.g., only one of) the first and/or second doping type. If, for example, the dopant like defects are dopant like defects of the second doping type, the superjunction region 1 may be produced such that the amount of second type dopants in the superjunction region 1 is lower than necessary in order to achieve a desired degree of compensation profile. The degree of compensation profile is then finally adjusted by forming the dopant like defects in the doping process.

In the process of forming the superjunction region 1, process variations may occur so that doping concentrations of the first and second regions 11, 12 are not exactly defined, but may vary within a certain range. Measuring the at least one characteristic of the superjunction region 1 and/or adapting the doping process dependent on the measured characteristic may help to precisely adjust the ratio between first type dopants and second type dopants in the superjunction region and/or, therefore, may help to (precisely, for example) adjust the voltage blocking capability. In this context, "first type dopants" may include first type dopant atoms and/or dopant like defects of the first type, and/or "second type dopants" may include second type dopant atoms and/or dopant like defects of the second type.

The superjunction region 1 may be formed using any kind of conventional process for forming a superjunction region of a superjunction device. One example for forming the superjunction region 1 includes a multi-epi-multi-implant (MEMI) process. In this kind of process, a plurality of epitaxial layers are grown one above the other on top of semiconductor layer 2 and first type dopant atoms and/or second type dopant atoms are implanted into each of these epitaxial layers such that the first and/or second regions 11, 12 are formed.

Referring to the above, the doping process includes adjusting at least one parameter of the doping process dependent on the at least one measured characteristic. According to one example, the at least one parameter is the implantation dose of particles implanted into the semiconductor body 100. Basically, the higher the implantation dose, the higher the concentration of defects generated by the implanted particles and, therefore, the higher the concentration of dopant like defects.

According to one example, the at least one parameter of the doping process that is adjusted dependent on the measured characteristic is the temperature of the annealing process. The annealing process may stabilize the defects that are associated with the dopant like defects.

Basically, the temperature in the annealing process is selected from between 200° C. and 900° C., in particular between 250° C. and 800° C. or between 300° C. and 700° C. During the annealing process, some of the defects may be removed (e.g., cured). Basically, the higher the temperature, the higher the portion of the defects that are cured. Thus, by suitably selecting the temperature in the annealing process, the concentration of the dopant like defects can be adjusted based on the defects produced by the implantation process.

The implantation energy is another parameter of the doping process. The implantation energy may be the energy at which the particles are implanted into the semiconductor body. The implantation energy may define how deep the particles are implanted into the semiconductor body from the respective first or second surface 101, 102 and/or may (further, for example) define a defect profile, that is, a distribution of the generated defects in the vertical direction. This is explained with reference to FIG. 8.

FIG. 8 illustrates vacancy concentrations in the semiconductor body 100 that have been obtained by implanting particles at two different implantation energies and the same implantation dose. Curve 201 represents the vacancy concentration obtained at a first implantation energy and curve 202 represents the vacancy concentration obtained at a second implantation energy higher than the first implantation energy. Just for the purpose of illustration, curves 201 and 202 have been obtained using a process in which the implanted particles are protons, the first implantation energy is 1.5 MeV, the second implantation energy is 2.5 MeV and the vertical dimension of the superjunction region 1 is 15 micrometers (μm).

Each implantation process may be associated with an end-of-range (EOR), which is the region in which the majority of the implanted particles come to rest. The higher the implantation energy, the larger is a distance between the surface into which the particles are implanted and the EOR. Referring to FIG. 8, there is a first region in which the vacancy concentration is essentially constant, a second region in which the vacancy concentration increases towards the EOR, and a third region in which the vacancy concentration rapidly decreases to zero.

Referring to FIG. 8, the implantation energy may be selected such that the EOR is located in the semiconductor region 2 arranged between the superjunction region 1 and the second surface 102. In this case, vacancies are generated at each vertical position of the superjunction region 1. According to one example, the implantation energy is selected such that a distance between the first surface 101 and the EOR may be between 1.2 times and 4 times the vertical dimension of the superjunction region 1. The vertical dimension of the superjunction region 1 may be the distance between the first and second vertical positions z1, z2.

If, for example, the implantation energy is such that the EOR is rather close to the superjunction region 1, as in the example represented by curve 201, the vacancy concentration and, therefore, the concentration of the dopant like defects, may increase within the superjunction region 1 towards the interface between the superjunction region 1 and the semiconductor layer 2. If, for example, the implantation energy is such that the EOR is more distant to the superjunction region 1, as in the example represented by curve 202, the vacancy concentration and, therefore, the concentration of the dopant like defects, may be essentially constant.

According to another example, the implantation energy is such that the EOR is located within the superjunction region 1. In this case, vacancies and, therefore, dopant like defects are generated (only, for example) in a section between the implantation surface and the EOR.

The implantation process may include two or more implantations that have at least one of different implantation energies and/or different implantation angles and, therefore, different EORs. The implantation energies and/or implantation angles may be selected such that (a) the EOR associated with each of the implantation process is located outside the superjunction region 1 (as illustrated in FIG. 8), (b) the EOR associated with each of the implantation process is located in the superjunction region 1, and/or (c) the EOR associated with at least one the implantation process is located inside the superjunction region 1 and the EOR associated with at least one the implantation process is located outside the superjunction region 1. Thus, by suitably selecting (i) the number of different implantation processes, (ii) the implantation dose in each of the implantation processes, and (ii) the implantation energy in each of the implantation processes, the vacancy concentration profile in the vertical direction z and, therefore, the doping concentration profile associated with the dopant like defects can be adjusted.

The same implantation process may be applied to the entire wafer, so that at each position of the wafer the same doping profile is produced by the doping process. According to another example, the wafer is subdivided into a plurality of sections and/or a dedicated implantation process is applied to each of these sections. If, for example, superjunction devices on the same wafer have different voltage blocking capabilities before the doping process, the implantation processes applied to different superjunction devices on the same wafer may be different in order to individually adjust the voltage blocking capabilities of the superjunction devices on the same wafer.

Referring to the above, the superjunction region 1 may be formed in an epitaxial layer. The epitaxial layer, before forming the first and second regions 11, 12, may have a (low) basic doping of the first and/or second doping type. In the wafer 1, the doping concentration of the basic doping may vary in a lateral direction such that the doping concentration decreases towards an edge of the wafer 1. Such variation of the basic doping concentration may have the effect that, after forming the first and/or second regions 11, 12 and/or before the doping process, the degree of compensation may vary in the lateral direction.

According to one example, the voltage blocking capability or the doping profile is measured at two or more different lateral positions, wherein each of these lateral positions is differently spaced from the edge. Furthermore, the implantation dose at the different lateral positions is adapted to the measured voltage blocking capabilities and/or doping profiles in order to achieve essentially the same voltage blocking capability at each lateral position on the wafer 1.

Referring to the above, the head structure 3 may be implemented in various ways. Some examples for implementing the head structure are explained with reference to FIGS. 9 to 12 in the following.

Figure 9:
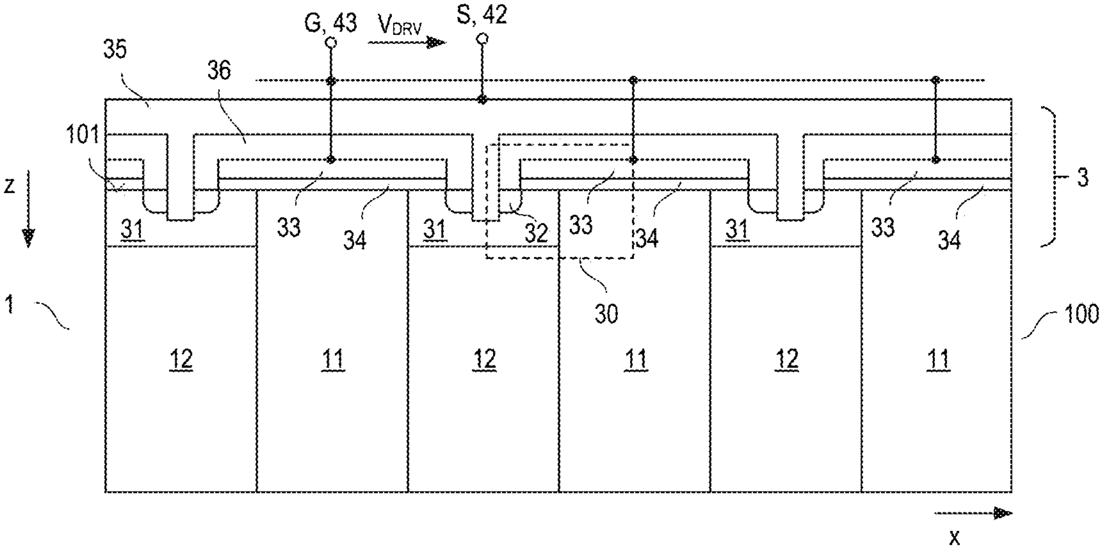
FIGS. 9-12 illustrate examples of head structures of the superjunction device.

FIG. 9 shows one example of the head structure 3 of a superjunction transistor device in greater detail. Besides the head structure 3, portions of the superjunction region 1 adjoining the head structure 3 are shown in FIG. 9. In the example shown in FIG. 9, the head structure 3 includes a plurality of transistor cells. Each transistor cell 30 includes a body region 31 of the second doping type, a source region 32 of the first doping type, a gate electrode 33, and/or a gate dielectric 311. The gate dielectric 311 may dielectrically insulate that gate electrode 33 from the body region 31. The body region 31 of each transistor cell 30 may separate the respective source region 32 from at least one of the plurality of first regions 11. The source region 32 and/or the body region 31 of each of the plurality of transistor cells 30 may be electrically connected to the second load node 42, which may form a source node S of the transistor device. "Electrically connected" in this context may mean ohmically connected. That is, there may be no rectifying junction between the source node S and/or the source region 32 and/or the body region 31. Electrical connections between the source node S and the source region 32 and the body region 31 of the individual control transistor cells 30 are only schematically illustrated in FIG. 2. The gate electrode 33 of each control transistor cell 30 may be electrically connected to the control node 43, which may form a gate node G of the transistor device.

Referring to the above, the body region 31 of each transistor cell may adjoin at least one first region 11. As the body region 31 is of the second doping type and/or the first region 11 is of the first doping type, there is a pn-junction between the body region 31 of each control transistor cell 30 and the at least one first region 11. These pn-junctions may form a pn-diode, which may sometimes be referred to as a body diode of the transistor device.

The gate electrodes 33 of the transistor cells 30 may be configured to control conducting channels in the body regions 31 along the gate dielectrics 34 between the source regions 32 and the first regions 11 dependent on a drive voltage (e.g., gate-source voltage) $V_{DRV}$ between the gate node G and the source node S. The transistor device may be in the conducting state when the gate-source voltage $V_{DRV}$ is such that there are conducting channels along the gate dielectrics 34. The transistor device may be in the blocking state when the gate-source voltage $V_{DRV}$ is such that the conducting channel is interrupted and/or a polarity of the load path voltage $V_{LP}$ (see, e.g., FIG. 1) is such that the pn-junctions between the first regions 11 and the body regions 31 are reverse biased. These pn-junctions may form the pn-junction at the first vertical position z1 explained with reference to FIG. 4.

In the example shown in FIG. 9, the gate electrode 33 of each transistor cell is a planar electrode arranged on top of the first surface 101 of the semiconductor body 100 and dielectrically insulated from the semiconductor body 100 by the respective gate dielectric 34.

Figure 10:
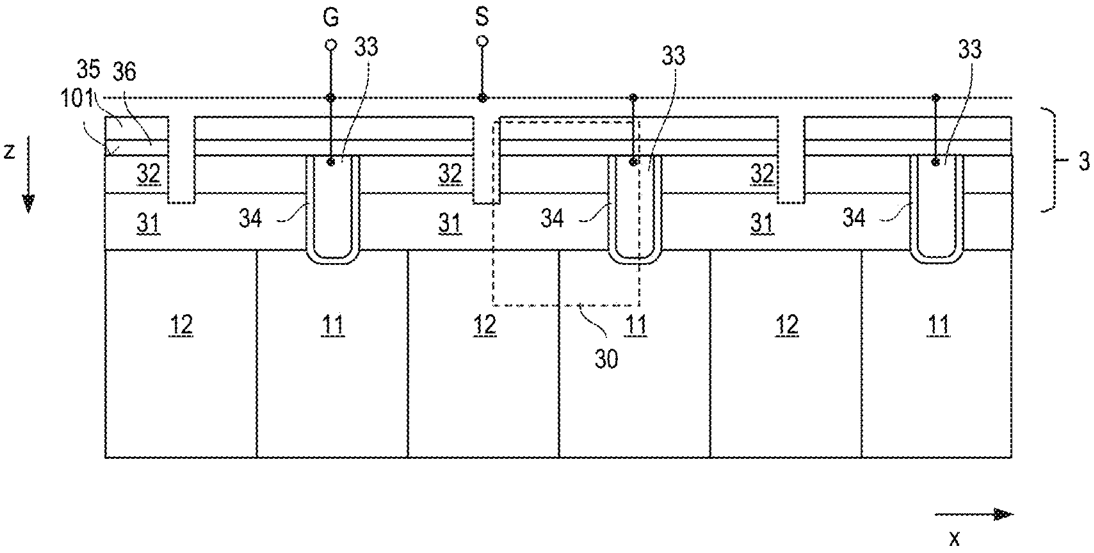

FIG. 10 shows a head structure 3 according to another example. The head structure 3 shown in FIG. 10 is different from the head structure 3 shown in FIG. 9 in that the gate electrode 33 of each transistor cell 30 is a trench electrode. That is, each gate electrode 33 is arranged in a respective trench that extends from the first surface 101 into the semiconductor body 100. Like in the example shown in FIG. 9, a gate dielectric 34 may dielectrically insulate the gate electrode 33 from the respective body region 31. The body region 31 and/or the source region 32 of each control transistor cell 30 may be electrically connected to the source node S. Further, the body region 31 may adjoin at least one first region 11 and/or may form a pn-junction with the respective first region 11.

In the examples shown in FIGS. 9 and 10, the transistor cells each include one gate electrode 33, wherein the gate electrode 33 of each control transistor cell 30 may be configured to control a conducting channel between the source region 32 of the respective control transistor cell 30 and one first region 11, so that each transistor cell is associated with one first region 11. Furthermore, as shown in FIGS. 9 and 10, the body region 31 of each transistor cell adjoins at least one second region 12, so that the second regions 12 are electrically connected to the source node S via the body regions 31 of the transistor cells 30.

Just for the purpose of illustration, in the examples shown in FIGS. 9 and 10, the body region 31 of each transistor cell adjoins one second region 12 so that each transistor cell is associated with one second region 12. Furthermore, in the examples, shown in FIGS. 9 and 10, the source regions 32 of two (or more) neighboring transistor cells are formed by one doped region of the first doping type, the body regions 31 of two (or more) neighboring transistor cells 30 are formed by one doped region of the second doping type, and/or the gate electrodes 33 of two (or more) transistor cells 30 are formed by one electrode. The gate electrodes 33 may include doped polysilicon, a metal, and/or the like.

The source regions 32 and the body regions 31 may be produced by implanting dopant atoms via the first surface into the semiconductor body 100. According to one example, the source regions 32 are produced such that their doping concentration may be higher than 1E19 $cm^{-3}$ and/or the body regions 31 are produced such that their doping concentration may be between 1E17 $cm^{-3}$ and 1E18 $cm^{-3}$.

In addition to the body regions 31 and the second regions 12 the transistor device may include shielding regions (not shown) of the second doping type. A doping concentration of these shielding regions may be higher than the doping concentration of the body regions 31. The shielding regions may adjoin the body regions 31 and/or the second regions 12 and/or may extend into the first regions 11. The shielding regions and the first regions 11 may form JFET (Junction Field Effect Transistor) like structures that may protect the gate dielectrics 34 against high electric fields as the drain-source voltage in the blocking state increases.

Associating one transistor cell of the plurality of transistor cells with one first region 11 and one second region 12, as illustrated in FIGS. 9 and 10, is merely an example. The implementation and the arrangement of the transistor cells of the head structure 3 are widely independent of (and/or not limited to) the specific implementation and arrangement of the first regions 11 and the second regions 12.

Figure 11:
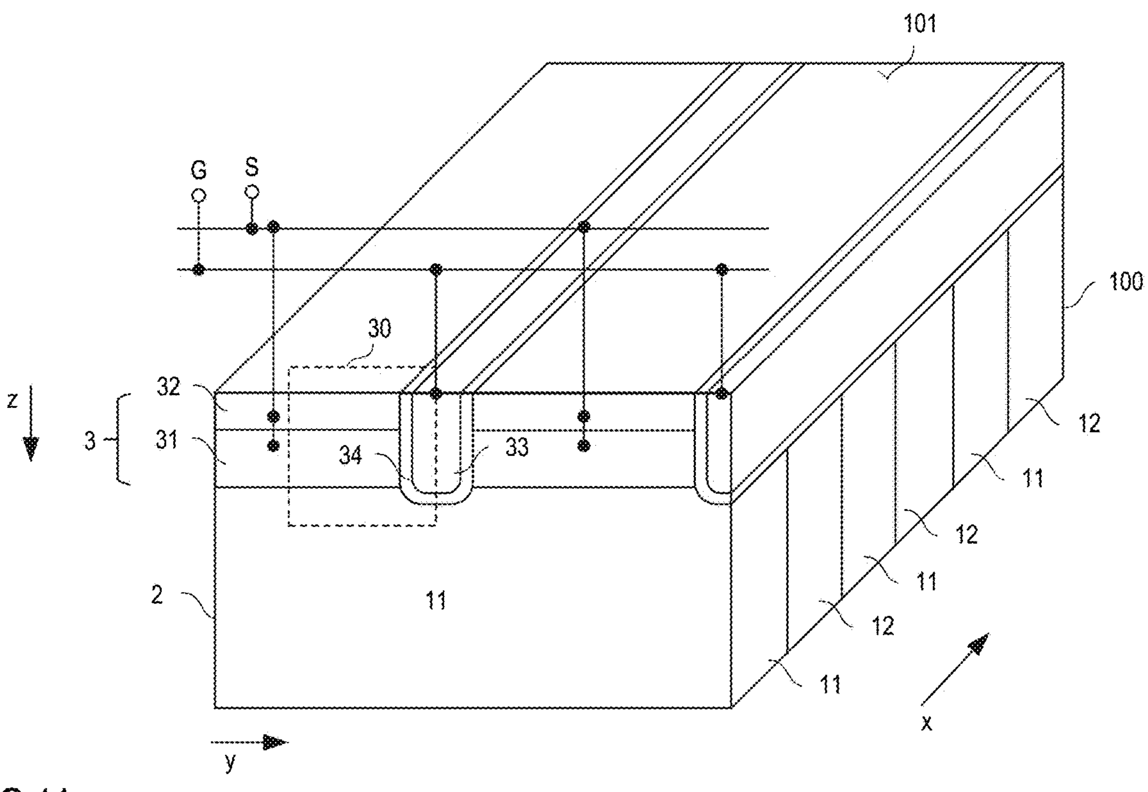

One example illustrating that the implementation and arrangement of the head structure 3 is widely independent of (and/or not limited to) the implementation and arrangement of the first and second regions 11, 12 is shown in FIG. 11. In this example, the first regions 11 and the second regions 12 are elongated in the second lateral direction y of the semiconductor body 100, while the source regions 32, the body regions 31, and the gate electrodes 33 of the individual control transistor cells 30 of the head structure 3 are elongated in the first lateral direction x perpendicular to the second lateral direction y. In this example, the body region 31 of one control transistor cell 30 adjoins a plurality of first regions 11 and second regions 12.

Figure 12:
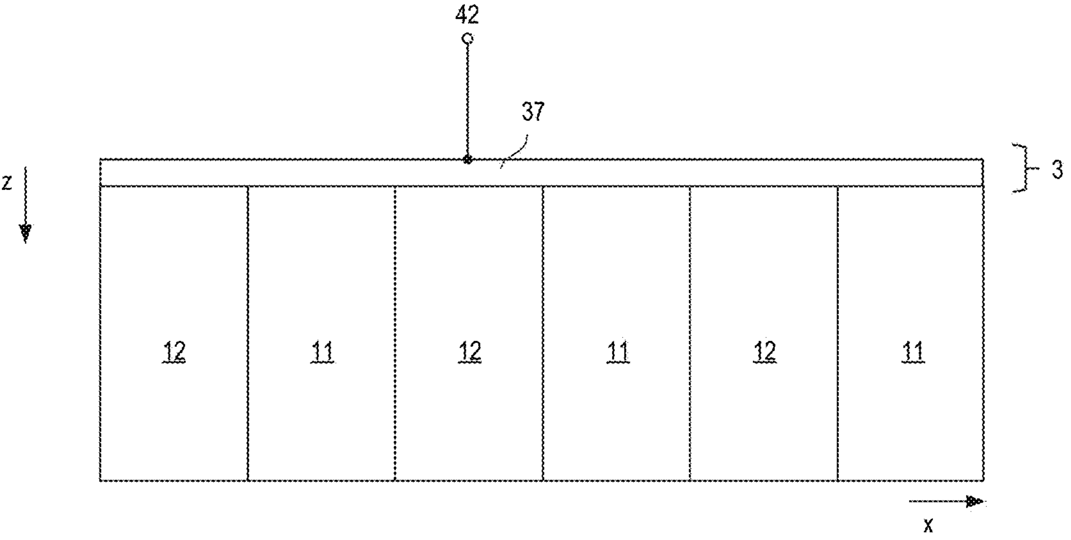

FIG. 12 illustrates one example of a head structure 3 of a Schottky diode. In this example, the head structure 36 includes a Schottky metal layer 36 that is connected to the second load node 42 and adjoins the first and second regions 11, 12. The Schottky metal layer 36 is such that Schottky junctions are formed between the Schottky metal layer 36 and the first regions 11 and/or ohmic connections are formed between the Schottky metal layer 36 and the second regions 12. The Schottky metal layer may include at least one of platinum (Pt), titanium (Ti), nickel (Ni), chromium (Cr), molybdenum (Mo), and/or tungsten (W).

The Schottky diode may be in the conducting state, when the load path voltage may have a polarity and/or magnitude that forward biases the Schottky junctions. Furthermore, the Schottky diode may be in the blocking state, when the load path voltage may have a polarity that reverse biases the Schottky junctions. The second load node 42 connected to the Schottky metal 36 may form an anode node of the Schottky diode, and/or the first load node (not shown in FIG. 12) may form a cathode node of the Schottky diode.

The invention claimed is:

1. A method comprising:

measuring a characteristic of a superjunction region of a SiC superjunction device, wherein the superjunction region is in a semiconductor body and comprises a plurality of first regions of a first doping type and a plurality of second regions of a second doping type, wherein the semiconductor body has a first surface and a second surface opposite the first surface, wherein a semiconductor layer of the first doping type is between the superjunction region and the second surface; and performing a doping process comprising:

implanting particles into the semiconductor body via the second surface to form crystal defects in the semiconductor body in the superjunction region; and generating dopant like defects, comprising acceptor like defects, of a doping type in the superjunction region based on the crystal defects, wherein an implantation energy in an implantation process associated with implanting the particles is determined such that an end-of-range of the implantation process is located in the semiconductor layer between the superjunction region and the second surface, and wherein a parameter of the doping process is based on the characteristic.

2. The method of claim 1, wherein measuring the characteristic of the superjunction region comprises measuring a voltage blocking capability of the superjunction device.

3. The method of claim 1, wherein measuring the characteristic of the superjunction region comprises measuring a vertical doping profile of the superjunction region.

4. The method of claim 1, wherein the parameter of the doping process is an implantation dose of the particles.

5. The method of claim 1, wherein the parameter of the doping process is a temperature of an annealing process associated with generating the dopant like defects.

6. The method of claim 1, wherein a temperature of an annealing process associated with generating the dopant like defects is between 200° C. and 900° C.

7. The method of claim 1, wherein the particles comprise at least one of a proton, a helium ion, or an electron.

8. The method of claim 1, wherein a vacancy is generated at each vertical position of the superjunction region.

9. A method comprising:

measuring a characteristic of a superjunction region of a SiC superjunction device, wherein the superjunction region is in a semiconductor body and comprises a plurality of first regions of a first doping type and a plurality of second regions of a second doping type; and performing a doping process comprising:

implanting particles into the semiconductor body to form crystal defects in the semiconductor body in the superjunction region; and generating dopant like defects of a doping type in the superjunction region based on the crystal defects, wherein a parameter of the doping process is based on the characteristic and is selected to control a defect-derived dopant-like defect profile within the superjunction region, including a vertical distribution of defect-derived dopant-like defects within the superjunction region, and wherein the semiconductor body comprises:

a first surface;

a second surface opposite the first surface; and a semiconductor layer of the first doping type between the superjunction region and the second surface.

10. The method of claim 9, wherein the particles are implanted via the first surface.

11. The method of claim 10, wherein an implantation energy in an implantation process associated with implanting the particles is determined such that an end-of-range of the implantation process is located in the semiconductor layer.

12. The method of claim 11, wherein the semiconductor layer comprises a first partial layer and a second partial layer, wherein the second partial layer is between the superjunction region and the first partial layer, and wherein the implantation energy is determined such that the end-of-range is located in the first partial layer.

13. The method of claim 11, wherein the semiconductor layer comprises a first partial layer and a second partial layer, wherein the second partial layer is between the superjunction region and the first partial layer, and wherein the implantation energy is determined such that the end-of-range is located in the second partial layer.

14. The method of claim 9, wherein the particles are implanted via at least one of the first surface or the second surface, and wherein an implantation energy in an implantation process associated with implanting the particles is determined such that an end-of-range of the implantation process is located in the superjunction region.

15. The method of claim 14, wherein the implantation process comprises a first partial implantation process and a second partial implantation process, and wherein the first partial implantation process has a different implantation energy than the second partial implantation process.

16. The method of claim 9, wherein the superjunction device comprises a head structure that is at least partially between the superjunction region and the first surface, and wherein the particles are implanted into the superjunction region through the head structure.

17. The method of claim 16, wherein the superjunction device is a superjunction transistor, and wherein the head structure comprises a plurality of transistor cells.

18. The method of claim 16, wherein the superjunction device is a superjunction diode, and wherein the head structure comprises at least one of an anode region or a cathode region.

19. A method comprising:

measuring a characteristic of a superjunction region of a SiC superjunction device, wherein the superjunction region is in a semiconductor body and comprises a plurality of first regions of a first doping type and a plurality of second regions of a second doping type; and performing a doping process comprising:

implanting particles into the semiconductor body to form crystal defects in the semiconductor body in the superjunction region; and generating dopant like defects, comprising acceptor like defects, of a doping type in the superjunction region based on the crystal defects, wherein an implantation energy in an implantation process associated with implanting the particles is determined such that an end-of-range of the implantation process is located in the semiconductor layer between the superjunction region and a second surface, wherein a semiconductor layer of the first doping type is between the superjunction region and the second surface, wherein a parameter of the doping process is based on the characteristic, and wherein the semiconductor body forms a portion of a wafer that comprises a plurality of semiconductor bodies.

20. The method of claim 19, wherein the implantation energy is selected such that a distance between a first surface and the end-of-range is between 1.2 times and 4 times a vertical dimension of the superjunction region.

21. The method of claim 19, wherein measuring the characteristic comprises measuring the characteristic at a first lateral position of the wafer, wherein the method further comprises measuring a second characteristic at a second lateral position of the wafer, and wherein, in an implantation process associated with implanting the particles, a first implantation dose is applied at the first lateral position based on the measuring of the characteristic at the first lateral position and a second implantation dose is applied at the second lateral position based on the measuring of the second characteristic at the second lateral position.

* * * * *